(12) United States Patent
Chi

(10) Patent No.: US 7,706,200 B2
(45) Date of Patent: *Apr. 27, 2010

(54) INTERNAL VOLTAGE GENERATOR

(75) Inventor: Sung-Soo Chi, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 16 days.

This patent is subject to a terminal disclaimer.

(21) Appl. No.: 12/357,641

(22) Filed: Jan. 22, 2009

(65) Prior Publication Data

US 2009/0129187 A1    May 21, 2009

Related U.S. Application Data

(63) Continuation of application No. 11/716,633, filed on Mar. 12, 2007, now Pat. No. 7,495,982.

(30) Foreign Application Priority Data

Sep. 28, 2006    (KR) ...................... 10-2006-0095164

(51) Int. Cl.
G11C 7/00 (2006.01)
G11C 7/06 (2006.01)
G11C 7/08 (2006.01)
G11C 7/12 (2006.01)

(52) U.S. Cl. .................. 365/203; 365/189.09; 365/207; 365/208

(58) Field of Classification Search ............ 365/189.09, 365/203, 207, 208
See application file for complete search history.

(56) References Cited

U.S. PATENT DOCUMENTS 5,426,616 A    6/1995    Kajigaya et al.
5,943,276 A *  8/1999    Casper .................. 365/201
5,982,349 A    11/1999   Yoon
6,222,787 B1   4/2001    Yoon et al.
7,046,074 B2   5/2006    Jang (Continued)

FOREIGN PATENT DOCUMENTS

JP    8-203269 A    8/1996

(Continued)

OTHER PUBLICATIONS

Korean Notice Of Allowance, issued in Korean Patent Application No. 10-2006-0095164, dated on Mar. 10, 2008.

Primary Examiner—Amir Zarabian
Assistant Examiner—Jay Radke
(74) Attorney, Agent, or Firm—IP & T Law Firm PLC

(57) ABSTRACT

An internal voltage generation device includes a plurality of output nodes; a bit line precharge voltage generation unit for generating a bit line precharge voltage; a first voltage drop unit for transferring the bit line precharge voltage to a first output node after decreasing the bit line precharge voltage by a first voltage drop amount in response to a test mode signal; and a second voltage drop unit for transferring the bit line precharge voltage to a second output node after decreasing the bit line precharge voltage by a second voltage drop amount in response to the test mode signal, wherein the second voltage drop amount is greater than the first voltage drop amount.

17 Claims, 5 Drawing Sheets

U.S. PATENT DOCUMENTS

| | | |
|---|---|---|
| 7,102,936 B2 | 9/2006 | Kim et al. |
| 2003/0062576 A1 | 4/2003 | Ishibashi et al. |
| 2004/0155701 A1 | 8/2004 | Kim et al. |
| 2005/0276134 A1* | 12/2005 | Mori et al. .................. 365/203 |
| 2006/0221749 A1 | 10/2006 | Kwean |
| 2007/0001752 A1 | 1/2007 | Jin |
| 2008/0002495 A1 | 1/2008 | Park |

FOREIGN PATENT DOCUMENTS

| | | |
|---|---|---|
| JP | 2006-190435 A | 7/2006 |
| JP | 2006-190436 A | 7/2006 |
| KR | 1998-013924 | 5/1998 |
| KR | 10-2000-0077268 | 12/2000 |
| KR | 10-2001-0004679 | 1/2001 |
| KR | 10-2001-0059290 | 7/2001 |

* cited by examiner

INTERNAL VOLTAGE GENERATOR

RELATED APPLICATIONS

This application is a Continuation of U.S. application Ser. No. 11/716,633, filed Mar. 12, 2007, now U.S. Pat. No. 7,495,982 claiming priority of Korean Application No. 10-2006-0095164, filed Sep. 28, 2006, the entire contents of each of which are hereby incorporated by reference.

CROSS-REFERENCE TO RELATED APPLICATIONS

The present invention claims priority of Korean patent application number 10-2006-0095164, filed on Sep. 28, 2006, which is incorporated by reference in its entirety.

BACKGROUND OF THE INVENTION

The present invention relates to semiconductor design technology, and more particularly, to an internal voltage generator for use in a semiconductor memory device and a method for operating the same.

Recently, it has been an issue to increase a storing quantity and an operational speed of a semiconductor memory device. However, in addition to these matters, it is also important to develop a low power semiconductor memory device with stable operation while running at a low power condition. Particularly for use in a portable system, e.g., a cellular phone and a laptop computer, a semiconductor memory device is required to consume less power.

One method of reducing power consumption is minimizing a current consumption of a core region included in a semiconductor memory device. The core region including a memory cell, a bit line and a word line is designed according to an extremely fine design-rule. Therefore, each memory cell has a very small size and consumes little power.

Particularly, a bit line precharge operation is an important technology for improving an operational speed of accessing a cell data. In a bit line precharge operation, a hit line is precharged to a predetermined voltage level before a data access so that the data access can be performed at high speed.

Under this condition, a memory cell has a mesh form where a plurality of word lines and a plurality of bit lines cross each other. Due to this structure, gate residue is generated because of a problem in a manufacturing process of a word line and a bit line. Due to the gate residue, a bridge phenomenon occurs. Such a bridge acts as a resistive short of a word line and a bit line.

FIG. 1 is a diagram showing a resistive short of a word line and a bit line.

As shown, a resistive short is generated due to the bridge phenomenon between a word line WL and a bit line pair BL and BLB. Under this condition, a leakage path is generated, i.e., a precharge voltage VBLP used for precharging the bit line pair BL and BLB at a standby state leaks to a ground of a word line driver 103 through the resistive short.

The above problem in a manufacturing process increases a power consumption of a semiconductor memory device and, thus, power efficiency is decreased and a performance of a product is degraded. For solving this problem, a bleeder circuit is provided.

FIG. 2 is a block diagram depicting a conventional bleeder circuit.

A bleeder circuit 203 is a bleeder transistor placed in a crossing between a word line array and a bit line sense amplifier array. Herein, a power supply voltage VEXTI is always biased to a gate of the bleeder transistor and the precharge voltage VBLP is supplied to a bit line precharge unit 201.

The bleeder circuit 203 is provided not in order to directly connect the precharge voltage VBLP to the bit line precharge unit 201, but to connect the precharge voltage VBLP to the bit line precharge unit 201 through the bleeder transistor so that a current flow is reduced by increased resistance.

Meanwhile, a bleed voltage VBLEED generated by the bleeder circuit 203 is transferred to the bit line precharge unit 201 through a particular wire. This is an option, i.e., if there is not the resistive short between the bit line and the word line, the general precharge voltage VBLP is supplied to the bit line precharge unit 201; otherwise, the bleed voltage VBLEED is supplied to the bit line precharge unit 201.

Therefore, there are different wires for transferring the precharge voltage VBLP and the bleed voltage VBLEED.

In this conventional circuit, even if the resistive short is not generated and, thus, the bleed voltage is not needed, the bleeder circuit 203 and the wire used for the bleed circuit 203 cannot be removed. Therefore, a size of a semiconductor memory device is increased.

Further, since a resistance due to the bridge between the word line and the bit line has a variable value, a amount of leakage current is variable. Accordingly, since only one VBLP, the conventional bleeder circuit has difficulty in corresponding to the various amount of a leakage current

SUMMARY OF THE INVENTION

Embodiments of the present invention are directed to provide an internal voltage generator for reducing a leakage current due to a bridge between a word line and a bit line and for reducing a chip size by removing the particular wire of the conventional bleeder circuit.

In accordance with an aspect of the present invention, there is provided an internal voltage generation device, including: a plurality of output nodes; a bit line precharge voltage generation unit for generating a bit line precharge voltage; a first voltage drop unit for transferring the bit line precharge voltage to a first output node after decreasing the bit line precharge voltage by a first voltage drop amount in response to a test mode signal; and a second voltage drop unit for transferring the bit line precharge voltage to a second output node after decreasing the bit line precharge voltage by a second voltage drop amount in response to the test mode signal, wherein the second voltage drop amount is greater than the first voltage drop amount.

In accordance with another aspect of the present invention, there is provided a method of operating an internal voltage generation device, including: measuring a leakage current due to a bridge resistance between a word line and a bit line; driving a bit line precharge voltage to a bit line precharge voltage supply unit by driving the bit line precharge voltage normally in response to a test mode signal for reducing power consumption when the leakage current is not generated at a standby mode; and driving the bit line precharge voltage with the bit line precharge voltage supply unit with an adjusted driving strength in response to the test mode signal when the leakage current is generated in a standby mode.

In accordance with a further aspect of the present invention, there is provided an internal voltage generation device, including: a precharge voltage supply unit for supplying a bit line precharge voltage to a semiconductor memory device; a voltage drop unit for dropping the level of the bit line precharge voltage as a leakage current is generated due to a bridge between a word line and a bit line; and a voltage drop control unit for controlling output voltages of the voltage drop unit in response to test mode signals and fuse cutting signals.

DESCRIPTION OF SPECIFIC EMBODIMENTS

It is an object of the present invention to provide an internal voltage generator for more reducing a leakage current due to a bridge between a word line and a bit line and for reducing a chip size by removing the particular wire of the conventional bleeder circuit. In accordance with the present invention, a leakage current can be reduced at a standby mode and, thus, a power consumption of a semiconductor memory device can be reduced. Further, a size of the semiconductor memory device can be reduced.

Hereinafter, an internal voltage generator in accordance with the present invention will be described in detail referring to the accompanying drawings.

Figure 1:
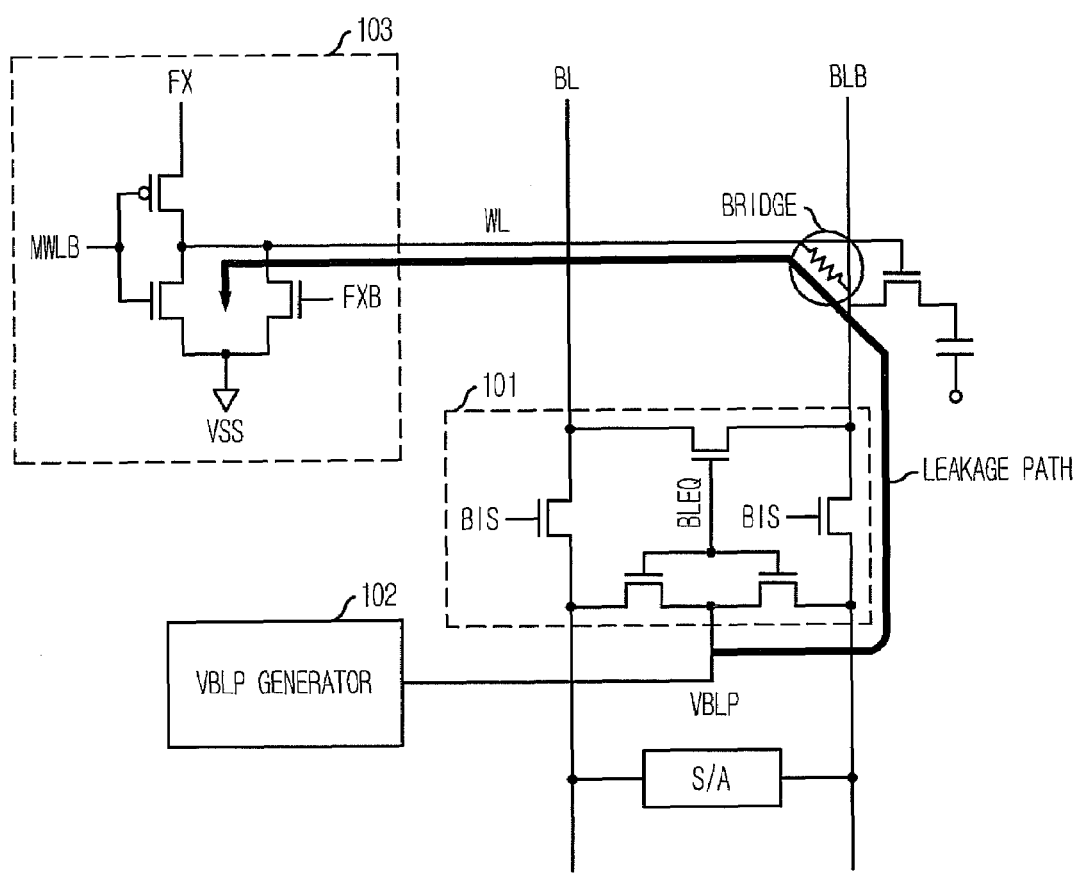
FIG. 1 is a diagram showing a resistive short of a word line and a bit line of a prior art semiconductor memory device.
Figure 2:
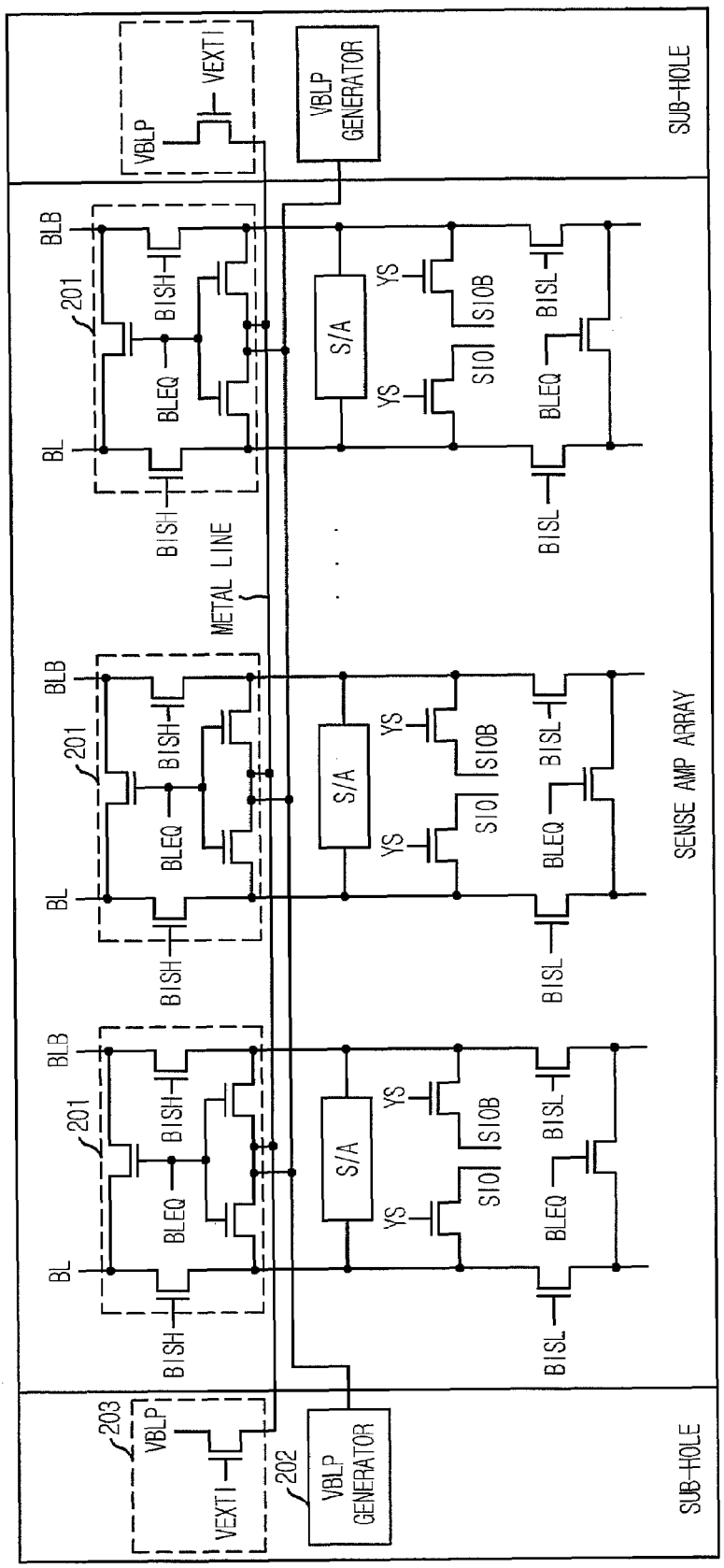
FIG. 2 is a block diagram depicting a prior art bleeder circuit.
Figure 3:
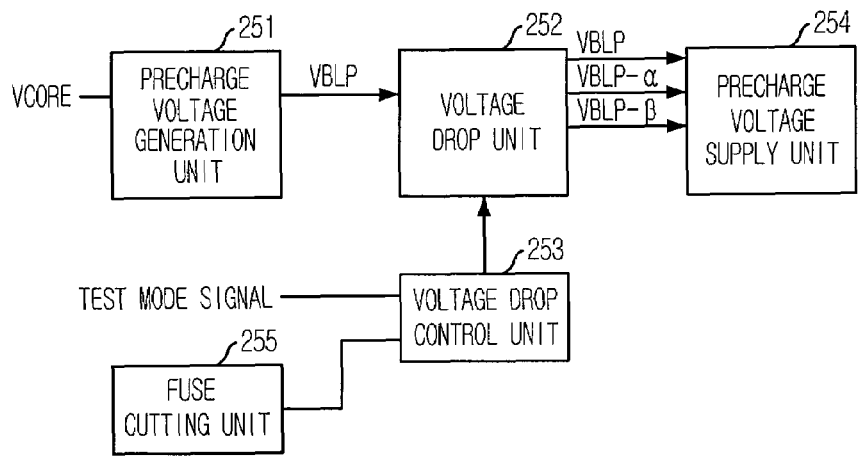
FIG. 3 is a block diagram showing a bleeder circuit in accordance with an embodiment of the present invention.

FIG. 3 is a block diagram showing a bleeder circuit in accordance with an embodiment of the present invention.

As shown, the bleeder circuit includes a precharge voltage generation unit 251, a voltage drop unit 252 and a voltage drop control unit 253.

The precharge voltage generation unit 251 generates a bit line precharge voltage VBLP by dividing a core voltage VCORE. The voltage drop unit 252 drops a voltage level of the bit line precharge voltage VBLP as a leakage current is generated due to a bridge between a word line and a bit line. The voltage drop control unit 253 controls output voltages VBLP, VBLP-α and VBLP-β of the voltage drop unit 252 according to a test mode signal and output signals of a fuse cutting unit 255.

Herein, the fuse cutting unit 255 is used for selecting a voltage drop amount based on a pre-measured leakage current amount for when a voltage level of the bit line precharge voltage VBLP is dropped. First, it is detected that a leakage current due to a bridge is being generated. Then, the amount of leakage current is measured.

When a test mode for dropping a voltage level of the bit line precharge voltage VBLP begins, the voltage level of the bit line precharge voltage VBLP is selectively dropped according to the measured leakage current amount. Thereafter, by a fuse cutting, one of the output voltages VBLP, VBLP-α and VBLP-β of the voltage drop unit 252 is supplied to a precharge voltage supply unit 254 as an optimum bit line precharge voltage. Or, by measuring the output voltages VBLP, VBLP-α and VBLP-β of the voltage drop unit 252 output through a plurality of test mode signals at the test mode, an optimum bit line precharge voltage can be determined and the optimum bit line precharge voltage to be supplied to the precharge voltage supply unit 254 is fixed by a fuse cutting.

Figure 4:
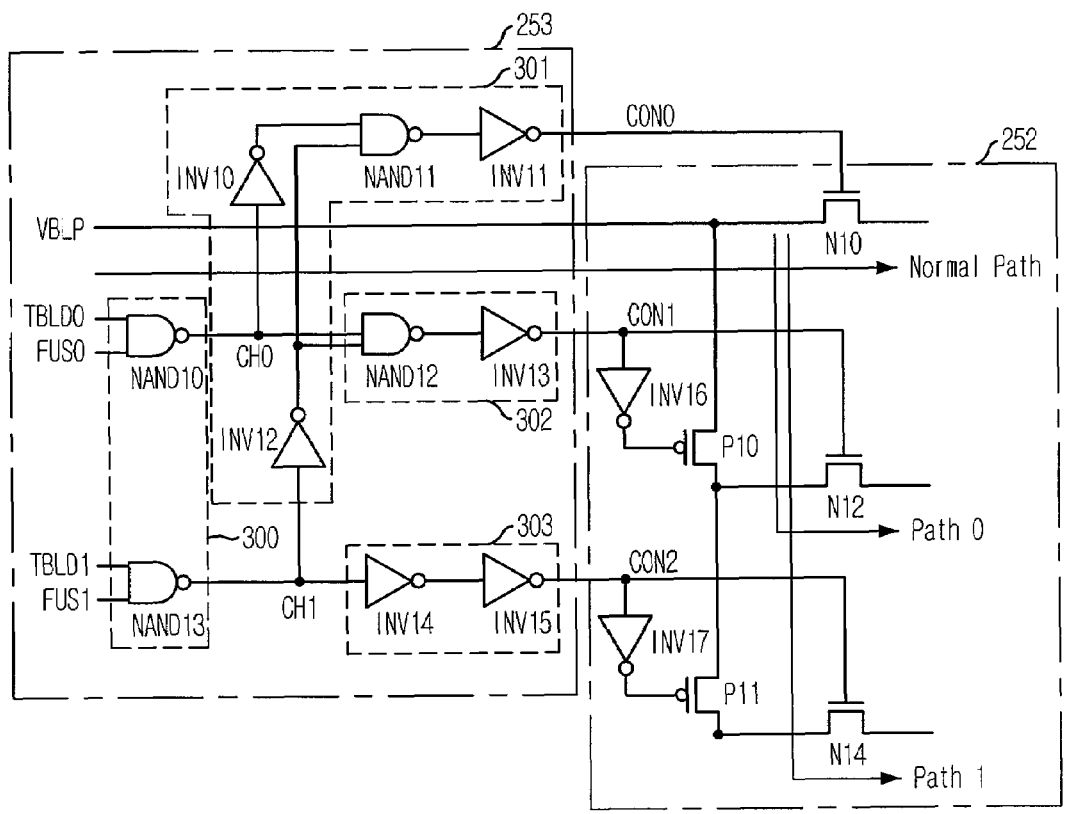
FIG. 4 is a schematic circuit diagram depicting a voltage drop control unit and a voltage drop unit shown in FIG. 3.

FIG. 4 is a schematic circuit diagram depicting the voltage drop control unit 253 and the voltage drop unit 252 shown in FIG. 3.

The voltage drop control unit 253 includes an intermediate signal generation unit 300, a normal path control unit 301, a first voltage drop path control unit 302 and a second voltage drop path control unit 303.

The intermediate signal generation unit 300 includes a first NAND gate NAND10 for receiving a first test mode signal TBLD0 and a first fuse cut signal FUS0 to generate a first intermediate signal CH0, and a second NAND gate NAND13 for receiving a second test mode signal TBLD1 and a second fuse cut signal FUS1 to generate a second intermediate signal CH1.

The normal path control unit 301 includes a first inverter INV10 for inverting the first intermediate signal CH0, a second inverter INV12 for inverting the second intermediate signal CH1, a third NAND gate NAND11 for receiving outputs of the first inverter INV10 and the second inverter INV12; and a third inverter INV11 for inverting an output of the third NAND gate NAND11 in order to output the inverted signal as a first control signal CON0.

Herein, the first control signal CON0 is transferred to the voltage drop unit 252 so that the bit line precharge voltage VBLP is supplied to the precharge voltage supply unit 254 when a semiconductor memory device is in normal operation.

Meanwhile, the first voltage drop path control unit 302 includes a fourth NAND gate NAND12 for receiving the first intermediate signal CH0 and the output of the second inverter INV12, and a fourth inverter INV13 for inverting an output of the fourth NAND gate NAND12 in order to output the inverted signal as a second control signal CON1.

Herein, the second control signal CON1 is transferred to the voltage drop unit 252 so that a voltage-dropped bit line precharge voltage (VBLP-a) is supplied to the precharge voltage supply unit 254 when the semiconductor memory device is in a standby mode.

Meanwhile, the second voltage drop path control unit 303 includes a fifth inverter INV14 and a sixth inverter INV15 for buffering the second intermediate signal CH1 in order to output the buffered signal as a third control signal CON2.

Herein, the third voltage control signal CON2 is transferred to the voltage drop unit 252 so that a voltage-dropped bit line precharge voltage (VBLP-β) is supplied to the precharge voltage supply unit 254 when the semiconductor memory device is in the standby mode.

Herein, between the voltage drop amounts α and β, β is greater than α.

Meanwhile, the voltage drop unit 252 includes a normal operation transistor N10, a first voltage drop transistor P10 and a second voltage drop transistor P11. Herein, it is possible that the voltage drop unit 252 includes more than two voltage drop transistors for more effectively coping with the leakage current.

The normal operation transistor N10 includes an n-type metal oxide semiconductor (NMOS) transistor whose gate receives the first control signal CON0 for transferring the bit line precharge voltage VBLP. The normal operation transistor N10 is a slim-typed transistor which is manufactured by thinly forming a gate insulation layer so that a threshold voltage Vt of the normal operation transistor N10 is low. Therefore, the bit line precharge voltage VBLP can be transferred with a minimized voltage drop when the semiconductor memory device is in the normal operation.

Meanwhile, the first voltage drop transistor P10 includes a p-type metal oxide semiconductor (PMOS) transistor whose gate receives an inverted version of the second control signal CON1 from a seventh inverter INV16. The second voltage drop transistor P11 includes a PMOS transistor whose gate receives an inverted version of the third control signal CON2 from an eighth inverter INV17.

Herein, the first and second voltage drop transistors P10 and P11 each have a different gate length in order to output the bit line precharge voltage VBLP with different voltage drop amounts.

Therefore, the voltage level of each of the bit line recharge voltages VBLP-α and VBLP-β respectively output from the first and second voltage drop transistors P10 and P11 is different from each other. Using this, a suitable voltage-dropped bit line precharge voltage VBLP can be supplied to the bit line precharge voltage supply unit 254 after measuring the leakage current amount so that a power consumption of the semiconductor memory device can be reduced.

Further, the voltage-dropped bit line precharge voltages VBLP-α and VBLP-β respectively generated by the first and second voltage drop transistors P10 and P11 are transferred to the bit line precharge voltage supply unit 254 by first and second NMOS transistors N12 and N14 respectively. Herein, a gate of the first NMOS transistor N12 receives the second control signal CON1 and a gate of the second NMOS transistor N14 receives the third control signal CON2. Therefore, it is desirable that each of the first and second NMOS transistors N12 and N14 is manufactured as a slim-typed transistor so as to have a low threshold voltage.

Figure 5:
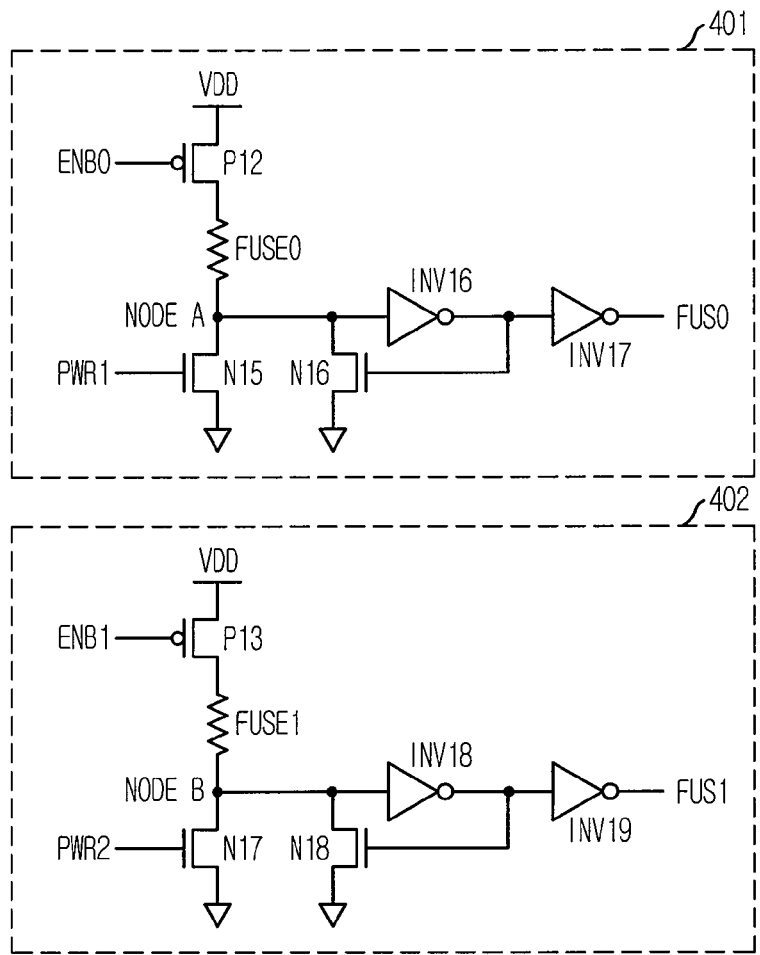
FIG. 5 is a schematic circuit diagram showing a fuse cutting unit shown in FIG. 3.

FIG. 5 is a schematic circuit diagram showing the fuse cutting unit 255 shown in FIG. 3.

As shown, the fuse cutting unit 255 includes a first fuse cut circuit 401 and a second fuse cut circuit 402 for transferring the first and second fuse cut signals FUS0 and FUS1 to the voltage drop control unit 253, respectively.

In detail, the first fuse cut circuit 401 includes a first PMOS transistor P12 whose gate receives a first enable signal ENB0; a first NMOS transistor N15 whose gate receives a first power-up signal PWR1; a first fuse FUSE0 connected between the first PMOS transistor P12 and a common output node NODE A which is a common output terminal of the first fuse FUSE0 and the first NMOS transistor N15; a first inverter INV16 for inverting an output signal from the common output node NODE A; a second NMOS transistor N16 whose gate receives an output of the first inverter INV16; and a second inverter INV17 for inverting the output of the first inverter INV16 in order to output the inverted signal as the first fuse cut signal FUS0.

Further, the second fuse cut circuit 402 includes a second PMOS transistor P13 whose gate receives a second enable signal ENB1; a third NMOS transistor N17 whose gate receives a second power-up signal PWR2; a second fuse FUSE1 connected between the second PMOS transistor P13 and a common output node NODE B which is a common output terminal of the second fuse FUSE1 and the third NMOS transistor N17; a third inverter INV18 for inverting an output signal from the common output node NODE B; a fourth NMOS transistor N18 whose gate receives an output of the third inverter INV18; and a fourth inverter INV19 for inverting the output of the third inverter INV18 in order to output the inverted signal as the second fuse cut signal FUS1.

Operations of the first and second fuse cut circuits 401 and 402 are described below. Herein, since operation of the second fuse cut circuit 402 is similar to that of the first fuse cut circuit 401, a detailed description for the operation of the second fuse cut circuit 402 is omitted.

As a first situation, it is assumed that the first fuse FUSE0 is connected. To begin with, when the first enable signal ENB0 is activated, the first PMOS transistor P12 is turned on and a power supply voltage VDD is supplied to the first fuse FUSE0. At this time, the first power-up signal PWR1 is in an inactivated state. Therefore, the output signal from the common output node NODE A becomes a logic high level, and the first and second inverters INV16 and INV17 buffer the output signal from the common output node NODE A to generate the first fuse cut signal FUS0.

As a second situation, it is assumed that the first fuse FUSE0 is not connected. Under this condition, even if the first enable signal ENB0 is activated, the first fuse cut signal FUS0 is not generated. Herein, the first power-up signal PWR1 is activated so that the output signal from the common node NODE A becomes a logic low level. Therefore, by buffering an output signal from the common node NODE A, the first fuse cut signal FUS0 is output as a logic low level.

Figure 6:
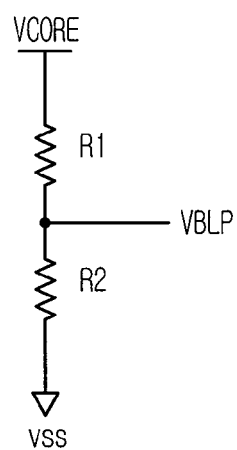
FIG. 6 is a schematic circuit diagram depicting a precharge voltage generation unit shown in FIG. 3.

FIG. 6 is a schematic circuit diagram depicting the precharge voltage generation unit 251 shown in FIG. 3.

As shown, the precharge voltage generation unit 251 is a divider for generating the bit line precharge voltage VBLP by dividing the core voltage VCORE. The divider includes two resistors R1 and R2. The two resistors can be replaced with transistors.

Figure 7:
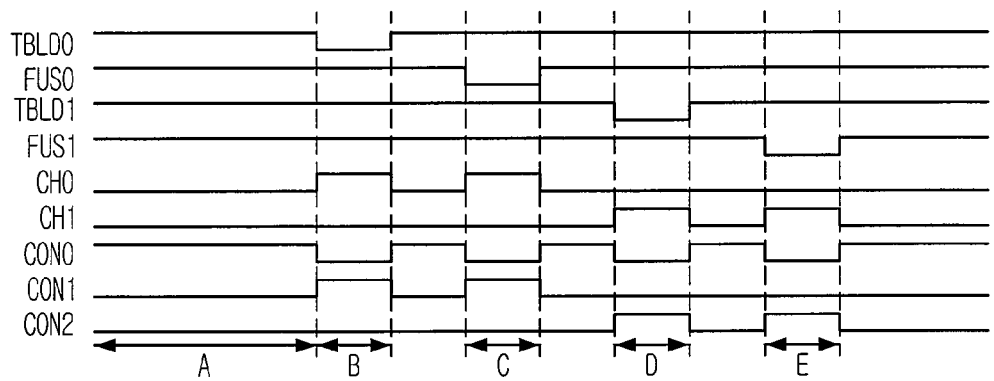
FIG. 7 is a timing diagram showing an operation of the bleeder circuit shown in FIG. 3.

FIG. 7 is a timing diagram showing an operation of the bleeder circuit shown in FIG. 3.

When the semiconductor memory device is in a normal operation mode (period A), the test mode signals TBLD0 and TBLD1 and the fuse cut signals FUS0 and FUS1 are all at a logic high level.

Accordingly, the normal operation transistor N10 is turned on so that the bit line precharge voltage VBLP is transferred to the bit line precharge supply unit 254 through a normal path.

Thereafter, when a leakage current is generated due to a bridge, the semiconductor memory device enters an initial test mode (period B). This is an initial test for detecting an optimum bit line precharge voltage.

Accordingly, the first test mode signal TBLD0 is activated as a logic low level and, thus, the first intermediate signal CH0 becomes a logic high level. In response to this operation, the first control signal CON0 becomes a logic low level; the second control signal CON1 becomes a logic high level; and the third control signal CON2 becomes a logic low level.

Therefore, the first voltage drop transistor P10 whose gate receives the inverted version of the second control signal CON1 is turned on and the first NMOS transistor N12 whose gate receives the second control signal CON1 is turned on so that the bit line precharge voltage VBLP-α voltage-dropped through the first voltage drop path (PATH0) is transferred to the bit line precharge voltage supply unit 254.

If the voltage dropped bit line recharge voltage VBLP-α is an optimum value for the leakage current, fuse FUSE0 is cut to fix the optimum value (period C).

Further, the semiconductor memory device enters a second test mode (period D) if an optimum bit line precharge voltage is not detected at the initial test (period B).

At the second test mode (period D), the second test mode signal TBLD1 is activated and, thus, the second intermediate signal CH1 becomes a logic high level. Accordingly, the third control signal CON2 becomes a logic low level, and the second voltage drop transistor P11 and the second NMOS transistor N14 are turned on in response to the third control signal CON2. Therefore, the bit line precharge voltage VBLP-β voltage-dropped by the second voltage drop transistor P11 is transferred to the bit line precharge voltage supply unit 254.

If the voltage-dropped bit line precharge voltage VBLP-β is an optimum value for the leakage current, fuse FUSE1 is cut to fix the optimum value (period D).

The optimum bit line precharge voltage (VBLP, VBLP-α, or VBLP-β) generated through the two test modes shows a feature of the present invention well. That is, the bridge resistance between a bit line and a word line is variable. Therefore, the leakage current amount is variable and, thus, it is difficult to cope with the leakage current by using the conventional bleeder circuit whose voltage drop amount is fixed. However, the bleeder circuit in accordance with the present invention overcomes the problem by varying a voltage drop amount in response to the observed leakage current amount.

Figure 8:
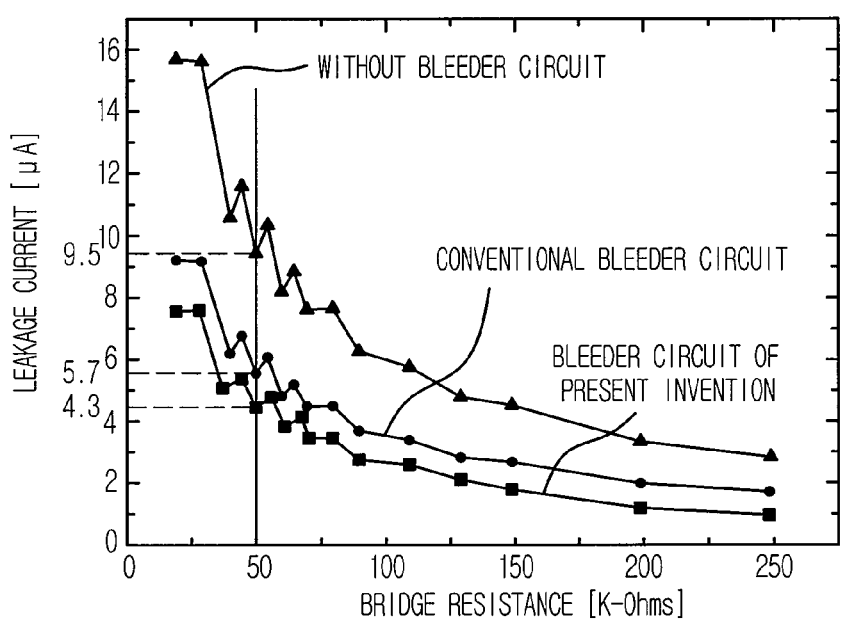
FIG. 8 is a graph showing a result of simulating leakage current amount due to the bridge resistance in a semiconductor memory device provided with the bleeder circuit in accordance with the present invention.

FIG. 8 is a graph showing a result of simulated leakage current amount due to the bridge resistance in a semiconductor memory device provided with the bleeder circuit in accordance with the present invention. Herein, it is assumed that the bridge resistance is 50 kΩ.

As shown, when the leakage current is generated in a semiconductor memory device not provided with a bleeder circuit, 9.5 uA of leakage current is generated; when the leakage current is generated in a semiconductor memory device provided with a conventional bleeder circuit, 5.7 uA of leakage current is generated. This result also shows that a conventional bleeder circuit can reduce the leakage current.

However, in a semiconductor memory device provided with the bleeder circuit in accordance with the present invention, only 4.3 uA of leakage current is generated.

As demonstrated by the simulation result, while a conventional bleeder circuit reduces the leakage current despite not detecting an optimum voltage drop amount according to the bridge resistance, the bleeder circuit in accordance with the present invention detects an optimum voltage drop amount in order to reduce the leakage current based on the detection result. Therefore, a power consumption of a semiconductor memory device can be reduced.

While the present invention has been described with respect to the specific embodiments, it will be apparent to those skilled in the art that various changes and modifications may be made without departing from the spirit and scope of the invention as defined in the following claims.

What claimed is:

1. An internal voltage generation device, comprising:
   a bit line precharge voltage generation unit for generating a bit line precharge voltage;
   a first voltage drop unit for transferring the bit line precharge voltage to an output node after decreasing the bit line precharge voltage by a first voltage drop amount;
   a second voltage drop unit for transferring the bit line precharge voltage to the output node after decreasing the bit line precharge voltage by a second voltage drop amount;
   a first control unit for controlling the first voltage drop unit in response to a test mode signal; and
   a second control unit for controlling the second voltage drop units in response to the test mode signal,
   wherein the second voltage drop amount is greater than the first voltage drop amount.

2. The internal voltage generation device as recited in claim 1, wherein the second voltage drop unit includes at least one voltage drop transistor connected between the output node and the bit line precharge voltage generation unit.

3. The internal voltage generation device as recited in claim 2, wherein the voltage drop transistors are a plurality of PMOS transistors having different gate lengths.

4. The internal voltage generation device as recited in claim 1, wherein the first voltage drop unit comprises a slim-typed NMOS transistor.

5. The internal voltage generation device as recited in claim 2, wherein the first and second control units include a plurality of fuse cutting circuits for selecting and maintaining one of output signals of the first and second control units by performing a fuse cutting operation.

6. The internal voltage generation device as recited in claim 5, wherein the test mode signal is output from a test mode unit included for selecting a voltage drop amount according to a leakage current.

7. The internal voltage generation device as recited in claim 6, wherein the first control unit includes:
   a first NAND gate for receiving a first test mode signal and a first fuse cut signal of the fuse cutting circuit;
   a second NAND gate for receiving a second test mode signal and a second fuse cut signal;
   a first inverter for inverting an output of the first NAND gate;
   a second inverter for inverting an output of the second NAND gate;
   a third NAND gate for receiving each output of the first and second inverters; and
   a third inverter for inverting an output of the third NAND gate.

8. The internal voltage generation device as recited in claim 7, wherein the second control unit includes:
   a fourth NAND gate for receiving outputs of the first NAND gate and the second inverter; and
   a fourth inverter for inverting an output of the fourth NAND gate.

9. The internal voltage generation device as recited in claim 5, wherein each fuse cutting circuit includes:
   a PMOS transistor whose gate receives an enable signal;
   a first NMOS transistor whose gate receives a power-up signal;
   a fuse connected between the PMOS transistor and the first NMOS transistor;
   a first inverter for inverting a signal at a common output terminal of the fuse and the first NMOS transistor;
   a second NMOS transistor whose gate receives an output of the first inverter; and
   a second inverter for inverting an output of the first inverter in order to output the inverted signal.

10. An internal voltage generation device, comprising:
   a bit line precharge voltage generation unit for generating a bit line precharge voltage;
   a voltage drop unit for receiving a bit line precharge voltage to generate a voltage controlled bit line precharge voltage in response to a control signal, wherein the voltage drop unit includes:
      a first voltage drop unit for receiving the bit line precharge voltage to generate a first voltage after decreasing the bit line precharge voltage by a first voltage drop amount as the voltage controlled bit line precharge voltage in response to a first control signal; and
      a second voltage drop unit for receiving the bit line precharge voltage to generate a second voltage after decreasing the bit line precharge voltage by a second voltage drop amount as the voltage controlled bit line precharge voltage in response to a second control signal; and a control unit for generating the first and second control signals in response to a test mode signal, wherein the second voltage drop amount is greater than the first voltage drop amount.

11. The internal voltage generation device as recited in claim 10, wherein the control unit includes:

a first control unit for generating the first control signal in response to the test mode signal; and a second control unit for generating the second control signal in response to the test mode signal.

12. The internal voltage generation device as recited in claim 11, wherein the voltage drop unit includes a third voltage drop unit for receiving the bit line precharge voltage to generate a third voltage after decreasing the bit line precharge voltage by a third voltage drop amount as the voltage controlled bit line precharge voltage in response to a third control signal, and wherein the control unit includes a third control unit for generating the third control signal in response to the test mode signal and the third voltage drop amount is greater than the second voltage drop amount.

13. The internal voltage generation device as recited in claim 12, wherein the control unit includes a plurality of fuse cutting circuits for selecting and maintaining one of the first, second and third control signals of the control unit by performing a fuse cutting operation.

14. The internal voltage generation device as recited in claim 13, wherein the first control unit includes:

a first NAND gate for receiving a first rest mode signal and a first fuse cut signal of the fuse cutting circuit;

a second NAND gate for receiving a second test mode signal and a second fuse cut signal;

a first inverter for inverting an output of the first NAND gate;

a second inverter for inverting an output of the second NAND gate;

a third NAND gate for receiving each output of the first and second inverters; and a third inverter for inverting an output of the third NAND gate.

15. The internal voltage generation device as recited in claim 14, wherein the second control unit includes:

a fourth NAND gate for receiving outputs of the first NAND gate and the second inverter; and a fourth inverter for inverting an output of the fourth NAND gate.

16. The internal voltage generation device as recited in claim 15, wherein the third control unit includes:

a fifth inverter for receiving outputs of the second NAND gate; and a sixth inverter for inverting an output of the fourth inverter.

17. The internal voltage generation device as recited in claim 13, wherein each fuse cutting circuit includes:

a PMOS transistor whose gate receives an enable signal;

a first NMOS transistor whose gate receives a power-up signal;

a fuse connected between the PMOS transistor and the first NMOS transistor;

a first inverter for inverting a signal at a common output terminal of the fuse and the first NMOS transistor;

a second NMOS transistor whose gate receives an output of the first inverter; and a second inverter for inverting an output of the first inverter in order to output the inverted signal.

* * * * *